(12) United States Patent
Longson et al.

(10) Patent No.: US 6,768,331 B2
(45) Date of Patent: Jul. 27, 2004

(54) WAFER-LEVEL CONTACTOR

(75) Inventors: Simon Longson, Newbury Park, CA (US); Alex Slocum, Bow, NH (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 10/125,449

(22) Filed: Apr. 16, 2002

(65) Prior Publication Data

US 2003/0193342 A1 Oct. 16, 2003

(51) Int. Cl.⁷ .............................................. G01R 31/02
(52) U.S. Cl. ...................................... 324/761; 324/754
(58) Field of Search ................................ 324/754, 758, 324/760, 761, 765

(56) References Cited

U.S. PATENT DOCUMENTS

| | | | | |
|---|---|---|---|---|
| 3,823,348 A | * | 7/1974 | Agusta et al. | 257/778 |
| 5,210,485 A | * | 5/1993 | Kreiger et al. | 324/758 |
| 5,434,513 A | | 7/1995 | Fujii et al. | |
| 5,532,610 A | | 7/1996 | Tsujide et al. | |
| 5,600,257 A | | 2/1997 | Leas et al. | |
| 5,610,335 A | * | 3/1997 | Shaw et al. | 73/514.36 |
| 5,959,462 A | | 9/1999 | Lum | |
| 5,977,787 A | | 11/1999 | Das et al. | |
| 6,043,671 A | * | 3/2000 | Mizuta | 324/754 |
| 6,064,213 A | | 5/2000 | Khandros et al. | |
| 6,150,830 A | * | 11/2000 | Schmid et al. | 324/761 |
| 6,300,786 B1 | | 10/2001 | Doherty et al. | |
| 6,337,576 B1 | | 1/2002 | Wiggin et al. | |
| 6,337,577 B1 | | 1/2002 | Doherty et al. | |
| 6,340,302 B1 | | 1/2002 | Ladd | |
| 6,356,089 B2 | * | 3/2002 | Bayer et al. | 324/761 |
| 6,362,639 B2 | * | 3/2002 | Lawrence et al. | 324/761 |
| 6,489,788 B2 | * | 12/2002 | Sausen | 324/761 |
| 6,489,790 B1 | * | 12/2002 | An et al. | 324/755 |
| 6,541,991 B1 | * | 4/2003 | Hornchek et al. | 324/754 |

FOREIGN PATENT DOCUMENTS

WO    WO9936948 A1 * 7/1999 ........... H01L/21/00

* cited by examiner

*Primary Examiner*—Evan Pert
*Assistant Examiner*—Jermele Hollington
(74) *Attorney, Agent, or Firm*—Lance Kreisman; Teradyne Legal Department

(57) ABSTRACT

A contact housing adapted for carrying a plurality of compliant contacts is described. The contact housing is for use in contacting a semiconductor wafer-level package having an array of contacts disposed in a predetermined pattern. The contact housing includes a first guide plate formed from a material having a temperature coefficient of expansion approximating that of the semiconductor wafer-level package. The guide plate has a first pattern of apertures formed by a microelectromechanical process such that the pattern of apertures matches the predetermined pattern of contacts on the wafer-level package. A second guide plate is formed similar to the first guide plate, and includes a second pattern of apertures disposed in vertical registration with the first pattern of apertures. A spacer is interposed between the first and second guide plates. The first and second guide plates cooperate with the spacer to form respective receptacles adapted for carrying the plurality of compliant contacts.

13 Claims, 4 Drawing Sheets

```
000000000  000000000
000000000  000000000
000000000  000000000
000000000  000000000
000000000  000000000

000000000  000000000
000000000  000000000
000000000  000000000
000000000  000000000
000000000  000000000

000000000  000000000
000000000  000000000
000000000  000000000
000000000  000000000
000000000  000000000

000000000  000000000
000000000  000000000
000000000  000000000
000000000  000000000
000000000  000000000
```

30

WAFER-LEVEL CONTACTOR

FIELD OF THE INVENTION

The invention relates generally to automatic test equipment, and more particularly to a wafer-level contactor used during the process of testing semiconductor devices during high-performance test or burn-in test procedures.

BACKGROUND OF THE INVENTION

Testing is an important process in the manufacture of semiconductor devices. At both the wafer and packaged-device levels, testing confirms whether individual devices are good or bad before the devices are employed in an electronic assembly.

Generally, a conventional manufacturing test flow for semiconductor devices begins with a probe test at the wafer-level under expected device operating conditions. Data from the test is used for a repair process, if the device is a memory device with redundant rows and columns. Following repair, the devices are diced from the wafer and packaged in a device housing. A burn-in test is then employed, where the devices are exposed to varying temperatures and operating conditions. Lastly, following burn-in, a high-performance test is undertaken on the packaged parts.

While this conventional test flow has served the industry well, those skilled in the art have recognized that if the burn-in process could be employed at the wafer level, then unnecessary packaging and testing steps could be avoided for devices that would fail burn-in. This could amount to substantial savings.

As a result, a proposal referred to as "known good die" has surfaced, where most if not all of the testing for semiconductor devices is done at the wafer level. This involves first subjecting the wafer to a high performance probe test, followed by a burn-in procedure. The results from the tests are then used to repair the devices at the wafer level. Passing devices and repaired devices are then packaged, as appropriate.

As noted above, a significant difference in the two test flow methodologies lies in having the burn-in process at the wafer level. Unfortunately, this is no easy task. Conventional wafer-level high-performance and burn-in techniques typically employ costly contactors that provide compliant contacts that are spaced at the same pitch as the wafer contacts. This pitch spacing can be on the order of approximately one-hundred micrometers. Additionally, because high performance and burn-in testing involves substantially elevating the temperature of the wafer, misalignments due to material expansion effects may result if the contactor has a different thermal coefficient of expansion than that of the semiconductor wafer.

One proposal that addresses this problem, in U.S. Pat. No. 5,977,787, to Das et al., utilizes a probe assembly that includes two parallel plates spaced apart by a support means. Disposed between the plates are thousands of permanently installed buckling beam probe contacts to engage correspondingly spaced contacts formed on a semiconductor wafer. The plates are formed of a material having a TCE that is close to the TCE of silicon. While this proposal appears beneficial for its intended applications, the cost to build a contactor with such tight pitch requirements between the contacts could be undersirably high.

Most recently, device manufacturers have noted the need to substantially change the packaging requirements for semiconductor devices. In some schemes, the devices are ready for implementation on a multi-chip module or printed-circuit-board without the conventional ceramic or plastic packaging. As shown in FIG. 1, this is made possible through a process known as "wafer-level packaging" (WLP).

Further referring to FIG. 1, WLP generally consists of a few additional process steps on a conventional wafer to space the available contacts further apart. The processing involves depositing a dielectric layer 10 and a copper redistribution layer 12 above the conventional device contact layer 14 to distribute the contact "targets" to a more useable pitch approaching that of conventional BGA spacings and the like. As a result, the contact "target" of the die/package changes from one-hundred microns to around three-hundred-fifty microns, and the pitch of these targets moves from less than one-hundred microns to around seven-hundred-fifty microns.

What is needed and currently unavailable is a contactor solution that takes advantage of wafer-level packaging to provide reliable low-cost contact to devices-under-test at the wafer level for both high-performance and burn-in testing. The wafer-level contactor of the present invention satisfies this need.

SUMMARY OF THE INVENTION

The wafer-level contactor of the present invention provides an economical approach to wafer-level contacting by employing proven components and low-cost manufacturing processes. As a result, per contact costs are minimized over the life of the contactor, resulting in substantial savings for device manufacturers, when compared with conventional wafer-level contacting schemes.

To realize the foregoing advantages, the invention in one form comprises a contact housing adapted for carrying a plurality of compliant contacts. The contact housing is for use in contacting a semiconductor wafer-level package having an array of contacts disposed in a predetermined pattern. The contact housing includes a first guide plate formed from a material having a temperature coefficient of expansion approximating that of the semiconductor wafer-level package. The guide plate has a first pattern of apertures formed by a microelectromechanical process such that the pattern of apertures matches the predetermined pattern of contacts on the wafer-level package. A second guide plate is formed similar to the first guide plate, and includes a second pattern of apertures disposed in vertical registration with the first pattern of apertures. A spacer is interposed between the first and second guide plates. The first and second guide plates cooperate with the spacer to form respective receptacles adapted for carrying the plurality of compliant contacts.

Other features and advantages of the present invention will be apparent from the following detailed description when read in conjunction with the accompanying drawings.

BRIEF DESCRIPTION OF THE DRAWINGS

The invention will be better understood by reference to the following more detailed description and accompanying drawings in which.

DETAILED DESCRIPTION OF THE INVENTION

Wafer-level burn-in offers significant cost savings for semiconductor manufacturers in terms of increased yields and lower test expenses. By taking advantage of wafer-level-packaging (WLP) techniques, costs can be further reduced by implementing a low-cost wafer-level-contactor in accordance with the present invention.

Figure 1:
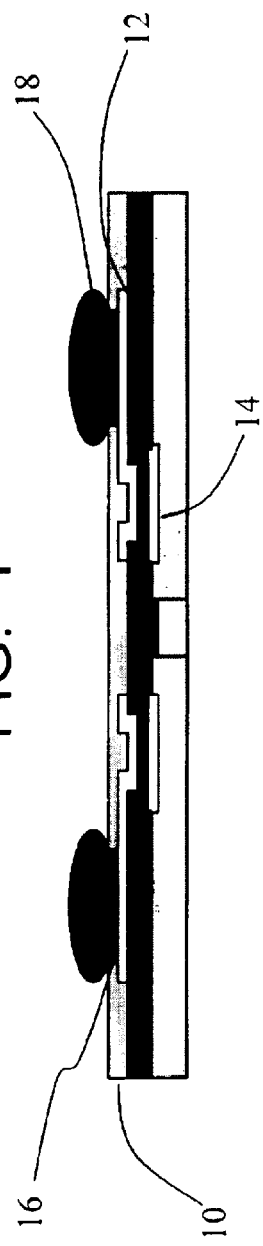
FIG. 1 is a partial cross-sectional view of a wafer-level packaging scheme.

With reference to FIG. 1, one WLP technique employs a "redistribution layer" 12 that electrically couples a device conductive bond pad 14 with an under-bump metalization layer 16. A solder ball 18 may then be deposited on the metalization layer. The reason for implementing the redistribution layer is to space adjacent contacts further apart in an effort to approximate existing chip-scale-packaging (CSP) and/or ball-grid-array (BGA) contact array pitches. The inventor has discovered that such WLP techniques provide an opportunity to significantly reduce the costs of a wafer-level contactor due to the increased contact-to-contact pitch spacings.

Figure 2:
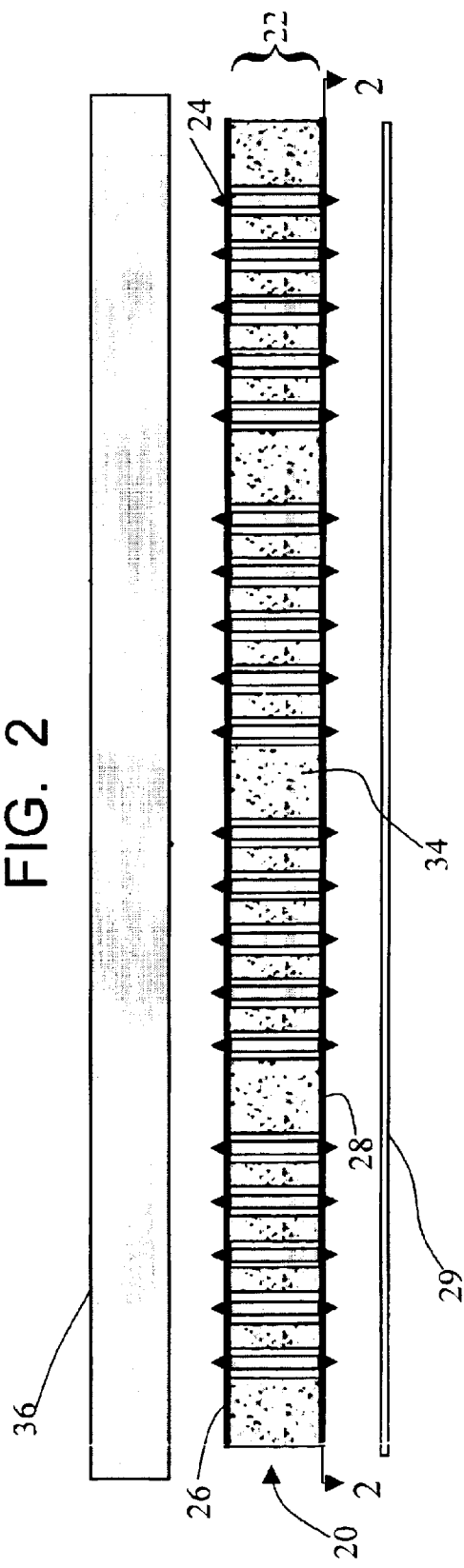
FIG. 2 is a high-level block diagram of a wafer-level contactor for engaging the wafer-level packaging of FIG. 1.

Referring now to FIG. 2, a wafer-level contactor according to one form of the present invention, generally designated 20, includes a contact housing 22 and an array of compliant contacts 24 adapted for receipt within the housing. By employing proven inexpensive replaceable contacts and manufacturing the contact housing according to a microelectromechanicalmachining (MEM) process, significant cost savings are realized.

Further referring to FIG. 2, the contact housing 22 includes a first guide plate 26 and a second guide plate 28. Each of the guide plates are formed from a silicon-based substrate having a thermal coefficient of expansion (TCE) very close to that of an expected wafer-under-test 29. Burn-in and high-performance test procedures often involve exposing the wafer-under-test and the contactor to extreme temperatures for extended periods. Consequently, by utilizing a guide plate material with the same TCE as the wafer-under-test 29, misalignments between the contactor contacts and the wafer-under-test contact pads, resulting from material expansion during test, are minimized.

Figure 3:
FIG. 3 is a longitudinal view of an aperture array along line 3—3 of FIG. 2.

With reference to FIG. 3, each of the guide plates 26 and 28 are formed with matching arrays of apertures 30. The aperture arrays match the pattern of contacts associated with each device contact array on the wafer-under-test 29. As explained more fully below, the apertures are formed into the guide plates according to a low-cost monolithic fabrication process. In an assembled state, the guide plates are vertically registered in parallel such that the aperture patterns lie in very close vertical alignment. The aperture diameters are sufficient to pass the tips of compliant contacts (more fully described below) therethrough, and small enough to retain the base of the contact.

To maintain the guide plates in a parallel vertical orientation, a spacer 34 is employed. The spacer may take the form of an integral silicon substrate (shown in FIG. 2) formed similar to the guide plates, or a plurality of spaced-apart standoffs (not shown) strategically disposed to provide optimal support throughout the structure. The width of the spacer corresponds to the length of the compliant contacts employed in the contact housing 22.

Further referring to FIG. 2, a preferred contact 24 for use in the contact housing is the proven and inexpensive micropogo pin. In general, and referring briefly to FIG. 5 (in phantom), the preferred pin comprises a contact barrel 60 with spring-biased tips 62 and 64 disposed at each end. The spring biasing provides compliance to ensure reliable contact over imperfect surface heights. Such pins vary in construction and are well known to those skilled in the art and warrant no further description.

It is contemplated that the guide plate aperture arrays described above in relation to the first embodiment of the wafer-level contactor will be fabricated using a monolithic process. A preferred example of such a process employs microelectromechanicalmachining (MEM) technology.

According to the preferred MEMs process, to make an array of apertures 30, fabrication begins with a silicon substrate. The substrate is then selectively etched according to a pattern matching the contact pattern on the wafer-under-test 29. Controlling the etched diameter of the holes may be accomplished by depositing an etch-resistant material on the sides of the apertures once the desired diameter is reached. Another possible way of etching involves employing a KOH process, well known to those skilled in the art, where the aperture walls typically define a 55 degree taper.

The fabrication steps for the integral silicon spacer 34 are similar to those for the guide plate aperture arrays. Layers are etched from a silicon substrate to define cylindrical cavities having diameters sufficient to receive the barrels of the micro-pogo pins 24. The tolerances for the spacer, however, are much broader and allow for a variety of manufacturing techniques besides the monolithic process identified above.

Once the guide plates 26 and 28 and spacer 34 are fabricated, the contactor 20 may then be assembled. Assembling the contact housing 22 involves first mounting one of the guide plates 26 or 28 to the spacer 34. The reduced-in-diameter apertures 30 of the mounted guide plate (in comparison to the spacer cavities) provide a receptacle structure to keep each pin 24 from sliding out of position. At this point, the pins are inserted into their corresponding spacer cavities such that the contact tips 62 and 64 project outwardly beyond the mounted guide plate. Once all the contacts have been installed, the remaining guide plate is fastened to the spacer. In this manner, the contacts are immovably constrained, with only the spring-biased tips providing compliance.

In operation, the wafer-level contactor 20 forms part of an interface assembly to connect a tester interface board 36 (FIG. 3) on a semiconductor tester (not shown) to the wafer-under-test 29. The tester generally provides an environmental chamber to elevate and reduce the temperature of the wafer-under-test while tester signals are applied to and captured from the devices on the wafer. Additionally, varying power levels are applied to the wafer-under-test under static operating conditions in an effort to accelerate failures among the devices.

Under these conditions, the thermal effects acting on the wafer-under-test 29 are also applied to the wafer-level-contactor 20. Because the TCE of the contactor materials are matched to the TCE of the wafer-under-test, any expansion or contraction of the wafer is compensated by an equivalent expansion or contraction of the contactor. As a result, changes in the contact alignments between the contactor and the wafer-under-test are minimized during the entire test.

Figure 4:
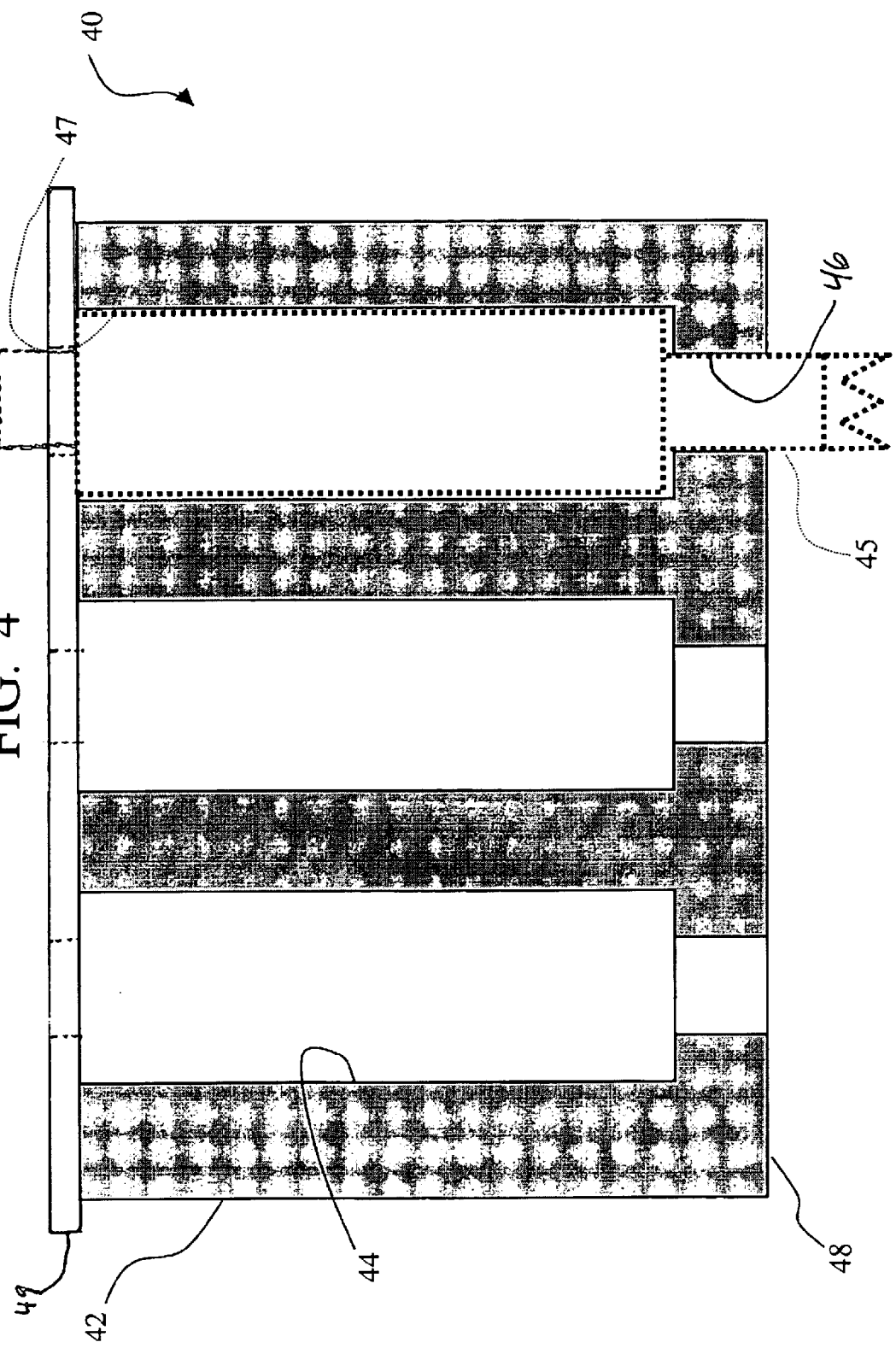
FIG. 4 is a partial cross-sectional view of a contact housing for use in a wafer-level contactor according to a second embodiment of the present invention.

Referring now to FIG. 4, a wafer-level contactor according to a second embodiment, generally designated 40 reduces costs further by employing an integral contact housing or base plate 42. The base plate is formed of a glass-based material having a TCE matching that of silicon. The single-piece structure includes receptacle cavities complementally constructed to receive and seat an array of dual-tipped micro-pogo pins 45 (in phantom). Each cavity comprises a counterbore 44 to receive a contact barrel 47, and a necked-down throughbore 46 connecting the counterbore to the wafer side 48 of the contact housing. A topside guide plate or captive layer 49 having formed apertures 51 cooperates with the base plate to define an array of receptacles to nest the pins 45.

Preferably, the contact housing 42 is fabricated using a low-cost ultrasonic drilling method to drill at depths of approximately 4.5 mm with counterbore diameters of approximately 0.6 mm, and center-to-center spacings of approximately 1 mm. The necked-down throughbore and guide plate diameters are approximately 0.3 mm, with axial depths of approximately 0.4 mm. It is to be understood that these dimensions are exemplary only, and that many variations in dimensions are possible to realize the benefits of the present invention.

Figure 5:
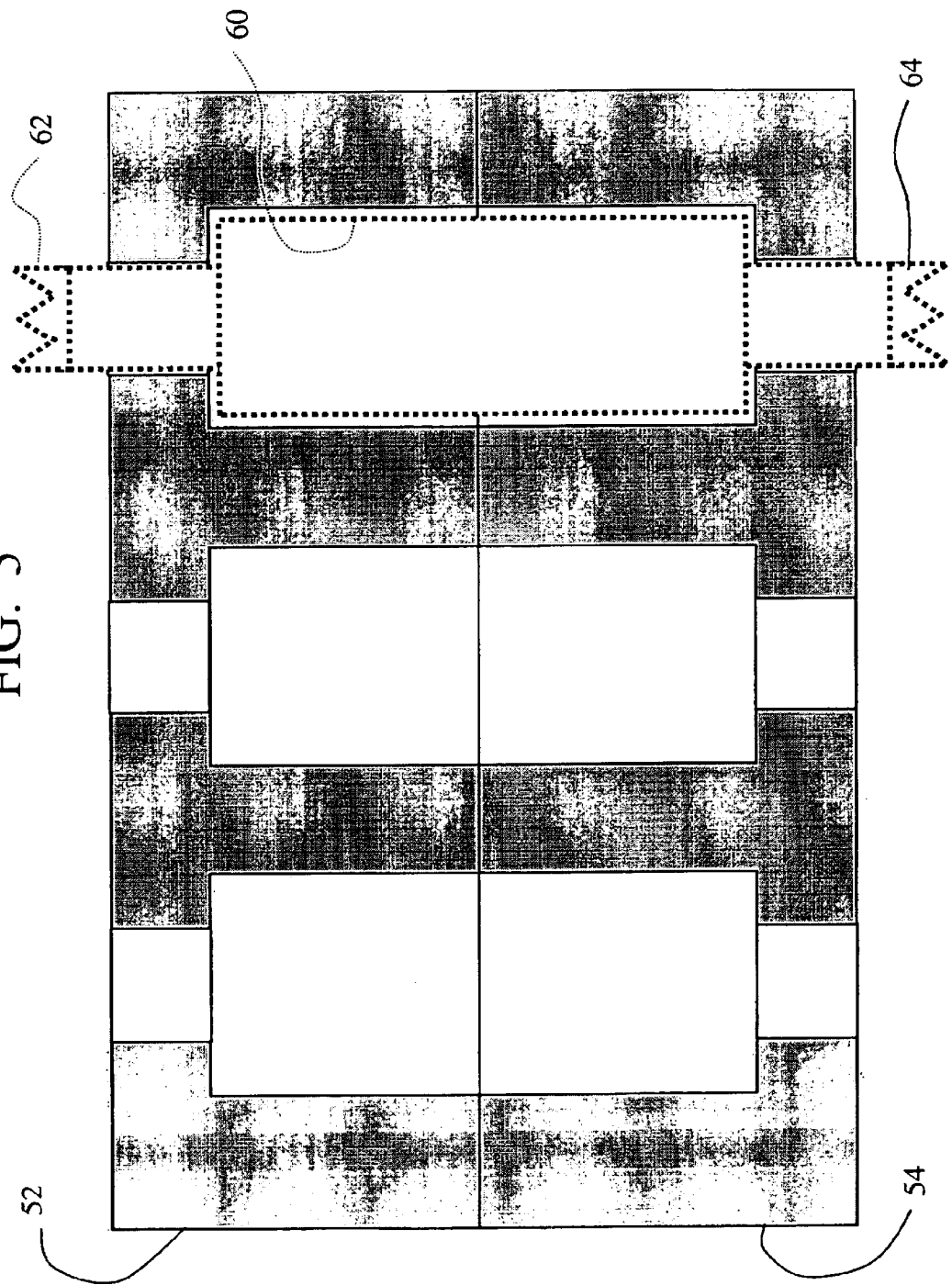
FIG. 5 is a partial cross-sectional view of a contact housing similar to the housing of FIG. 4.

FIG. 5 illustrates a variant of the base plate contact housing described above by breaking the assembly down into respective first and second base plates that define mirrored halves 52 and 54. When assembled, the mirrored halves lie in confronting relationship such that the cavities of the first base plate communicate with the cavities of the second plate. The compliant contacts are thus seated within the cavities. This enables use of a dual-tipped contact barrel 60 and allows for more straightforward assembly and pin replacement.

As to pin replacement, all of the contact housing embodiments described herein lend themselves well to straightforward pin replacement. This is important due to the very high number of contacts involved. Should one or more contacts become damaged, replacement of the pin is possible without having to replace the entire contactor.

Those skilled in the art will appreciate the many benefits and advantages afforded by the present invention. Of significant importance is the use of low-cost fabrication techniques and contacts to take advantages of wafer-level-packaging. By reducing costs in this manner, test costs are correspondingly minimized.

While the invention has been particularly shown and described with reference to the preferred embodiments thereof, it will be understood by those skilled in the art that various changes in form and detail may be made therein without departing from the spirit and scope of the invention.

What is claimed is:

1. A contact housing adapted for receiving a plurality of compliant contacts, the contact housing for use to engage a wafer-under-test, the wafer-under-test having a wafer coefficient of thermal expansion and including an array of conductive contact pads disposed in a wafer-level-packaged pattern, the contact housing including:

a first plate formed with a first pattern of apertures, the first pattern of apertures corresponding to at least a portion of the wafer-level-packaged pattern, the first plate consisting only of a material having a coefficient of thermal expansion matching the wafer coefficient of thermal expansion; and a second plate formed with a second pattern of apertures, the second pattern of apertures disposed in a spaced-apart relationship for registering vertically with the first pattern of apertures, the first and second plates cooperating to define a plurality of contact receptacles for nesting the compliant contacts.

2. A contact housing according to claim 1 wherein: the first plate consists only of a semiconductor material.

3. A contact housing according to claim 2 wherein: the apertures are formed by a monolithic process.

4. A contact housing according to claim 3 wherein: the monolithic process comprises a microelectromechanicalmachining process.

5. A contact housing according to claim 1 wherein: the second plate is formed similar to the first plate.

6. A contact housing according to claim 5 and further including:

a spacer disposed between the first and second plates.

7. A contact housing adapted for receiving a plurality of compliant contacts, the contact housing for use to engage a wafer-under-test, the wafer-under-test having a wafer coefficient of thermal expansion and including an array of conductive contact pads disposed in a wafer-level-packaged pattern, the contact housing including:

a first guide plate consisting only of a material having a temperature coefficient of expansion approximating that of the semiconductor wafer-level package, the first guide plate having a first pattern of apertures formed by a monolithic process, the pattern of apertures matching the predetermined pattern of contacts on the wafer-level package;

a second guide plate formed similar to the first guide plate, and having a second pattern of apertures disposed in vertical registration with the first pattern of apertures; and a spacer interposed between the first and second guide plates, the first and second guide plates cooperating with the spacer to form respective receptacles adapted for carrying the plurality of compliant contacts.

8. A contact housing according to claim 7 wherein: the first plate consists only of a semiconductor material.

9. A contact housing according to claim 7 wherein: the monolithic process comprises a microelectromechanicalmachining process.

10. A contact housing according to claim 7 wherein: the spacer is formed of a plate of semiconductor material.

11. A contact housing adapted for receiving a plurality of compliant contacts, the contacts having contact bodies and contact tips, the contact housing for use to engage a wafer-under-test, the wafer-under-test having a wafer coefficient of thermal expansion and including an array of conductive contact pads disposed in a wafer-level-packaged pattern, the contact housing including:

a base plate consisting only of a glass-based material having a coefficient of thermal expansion matching that of the wafer coefficient of thermal expansion, the base plate formed with a plurality of spaced-apart cavities having openings corresponding to the wafer-level-packaged pattern of contact pads, the cavities formed to receive the compliant contact bodies;

a captive plate disposed in stacked relationship with the base plate and having apertures corresponding to the spaced-apart cavities, the apertures formed to allow the contact tips to pass therethrough while retaining the contact bodies within the cavities.

12. A contact housing adapted for receiving a plurality of compliant contacts, the contacts having contact bodies and contact tips, the contact housing for use to engage a wafer-under-test, the wafer-under-test having a wafer coefficient of thermal expansion and including an array of conductive contact pads disposed in a wafer-level-packaged pattern, the contact housing including:

a first base plate consisting only of a glass-based material having a coefficient of thermal expansion matching that of the wafer coefficient of thermal expansion, the base plate formed with a plurality of spaced-apart openings having counterbored cavities and necked-down throughbores corresponding to the wafer-level-packaged pattern of contact pads, the cavities formed to receive the compliant contact bodies, the throughbores formed to receive the contact tips; and a second base plate formed similar to the first base plate and adapted for disposition in confronting relationship with first base plate to retain the compliant contacts within the respective cavities.

13. A wafer-level-contactor, the wafer-level-contactor for use to engage a wafer-under-test, the wafer-under-test having a wafer coefficient of thermal expansion and including an array of conductive contact pads disposed in a wafer-level-packaged pattern, the wafer-level-contactor including:

a plurality of compliant contacts;

a first plate formed with a first pattern of apertures, the first pattern of apertures corresponding to at least a portion of the wafer-level-packaged pattern, the first plate consisting only of a material having a coefficient of thermal expansion matching the wafer coefficient of thermal expansion; and a second plate formed with a second pattern of apertures, the second pattern of apertures disposed in a spaced-apart relationship for registering vertically with the first pattern of apertures, the first and second plates cooperating to define a plurality of contact receptacles for nesting the plurality of compliant contacts.

* * * * *